(12) United States Patent
Hsueh et al.

(10) Patent No.: US 7,919,832 B2
(45) Date of Patent: Apr. 5, 2011

(54) STACK RESISTOR STRUCTURE FOR INTEGRATED CIRCUITS

(75) Inventors: Fu-Lung Hsueh, Hsinchu (TW); Sung-Chieh Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 393 days.

(21) Appl. No.: 11/652,895

(22) Filed: Jan. 11, 2007

(65) Prior Publication Data
US 2008/0169514 A1 Jul. 17, 2008

(51) Int. Cl.
*H01L 29/06* (2006.01)
(52) U.S. Cl. .......................... 257/619; 257/767; 438/462
(58) Field of Classification Search .................. 257/379, 257/536, 758, 619, 767, 797; 438/637, 462, 438/401
See application file for complete search history.

(56) References Cited

U.S. PATENT DOCUMENTS

| 6,159,872 | A  | * | 12/2000 | Essaian et al. | 438/787 |
| 6,271,084 | B1 | * | 8/2001  | Tu et al.      | 438/253 |
| 6,700,203 | B1 | * | 3/2004  | Cabral, et al. | 257/774 |
| 6,872,655 | B2 | * | 3/2005  | Mahalingam et al. | 438/637 |
| 2002/0024115 | A1 | * | 2/2002 | Ibnabdeljalil et al. | 257/620 |
| 2006/0054975 | A1 | * | 3/2006 | Chen et al. | 257/384 |

FOREIGN PATENT DOCUMENTS

CN 1677671 10/2005

OTHER PUBLICATIONS

CN PTO Office Action, Mar. 6, 2009.

* cited by examiner

*Primary Examiner* — Zandra Smith
*Assistant Examiner* — Telly D Green
(74) *Attorney, Agent, or Firm* — K&L Gates LLP

(57) ABSTRACT

A resistor structure for an integrated circuit includes a first set of contacts connected between a semiconductor layer and a first conductive layer; and a second set of plugs connected between the first conductive layer and a second conductive layer, wherein the first set of contacts and the second set of plugs are coupled together as a first resistor segment to provide a predetermined resistance for the integrated circuit.

14 Claims, 6 Drawing Sheets

_US 7,919,832 B2_

STACK RESISTOR STRUCTURE FOR INTEGRATED CIRCUITS

BACKGROUND

The present invention relates generally to an integrated circuit (IC) design, and more particularly to a stack resistor structure for integrated circuits.

An IC often contains many resistors. For example, an analog-to-digital converter (ADC) may include many groups of resistors for dividing the voltage. Ideally, the resistance of the groups of resistors should match in order to divide the voltage equally. Conventionally, the resistors are fabricated by forming a number of silicided or non-silicided polysilicon layers on a silicon wafer. The resistors can also be fabricated by forming N-type or P-type doped regions in the semiconductor substrate of the wafer.

One drawback of the conventional resistor is that it requires a large surface area. For example, for a reference voltage resistor-ladder used in an 8-bit ADC, the resistor formed on a polycide layer with sheet resistivity of 10 ohm/sq needs an area of approximate 30 $\mu m^2$ to provide 1 ohm resistance. As another example, the resistor formed on a metal layer with sheet resistivity of 40 mohm/sq needs an area of approximate 625 $\mu m^2$ to provide 1 ohm resistance.

Moreover, the conventional resistors have relatively poor resistance-matching uniformity. This creates uneven voltages when the resistors are used as voltage dividers in an ADC.

SUMMARY

The present invention discloses a resistor structure for an IC. In one embodiment of the present invention, the resistor structure includes a first set of contacts connected between a semiconductor layer and a first conductive layer; and a second set of plugs connected between the first conductive layer and a second conductive layer, wherein the first set of contacts and the second set of plugs are coupled together as a first resistor segment to provide a predetermined resistance for the integrated circuit.

The construction and method of operation of the invention, however, together with additional objects and advantages thereof will be best understood from the following description of specific embodiments when read in connection with the accompanying drawings.

DESCRIPTION

Figure 1:
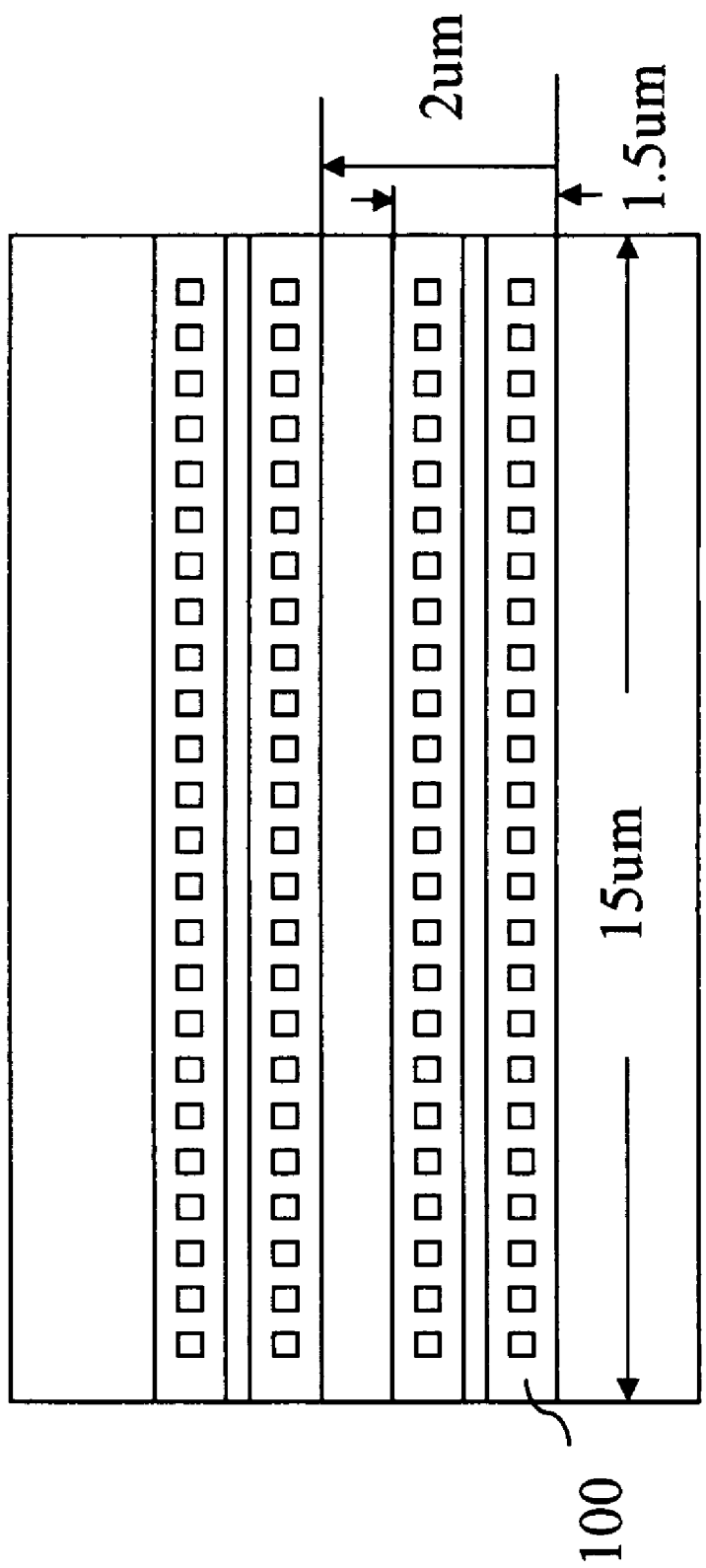
FIG. 1 illustrates a top view of conventional polycide resistors.

FIG. 1 illustrates a top-view of a polycide-resistor 100, which occupies a relatively large layout area. In a conventional ADC, physical dimensions of a reference voltage resistor-ladder need to be wide enough in order to minimize resistance variation due to process fluctuation. This allows large current to flow through the resistor-ladder, thereby minimizing switching noise. Supposing the sheet resistivity of polycide layer is about 10 ohms/sq, the resistor 100 needs to have a width of 15 $\mu m$ and a length of 1.5 $\mu m$ in order to provide 1 ohm resistance. Taking the marginal space requirement into account, the length of the resistor 100 minimally requires 2 $\mu m$. Thus, for 1 ohm resistance, the resistor 100 requires a minimum area of 30 $\mu m^2$ (2 $\mu m$ * 15 $\mu m$).

Figure 2:
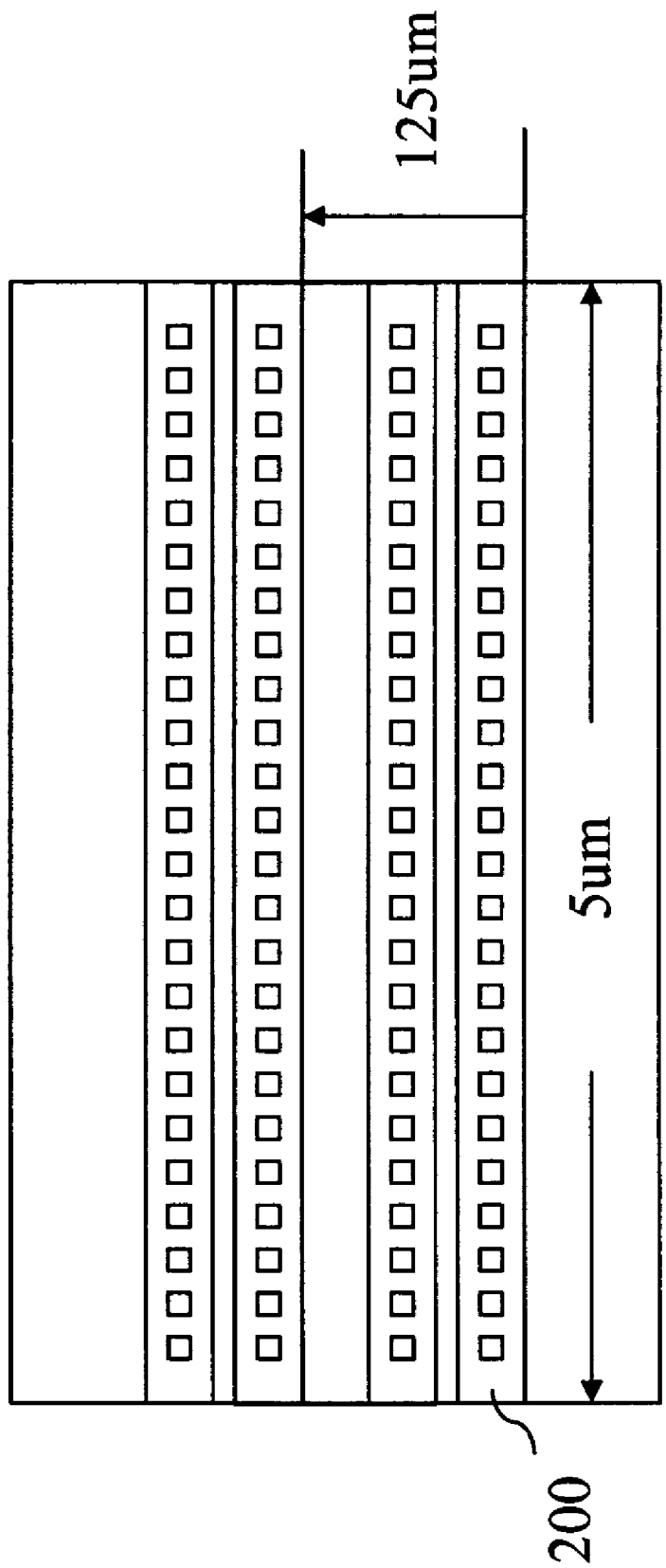
FIG. 2 illustrates a top view of conventional metal resistors.

FIG. 2 illustrates a top-view of a metal-resistor 200, which also occupies a relatively large layout area. Supposing the sheet resistivity of metal layer is about 40 m ohms/sq, the resistor 200 needs to have a width of 5 $\mu m$ and a length of 125 $\mu m$ (with the marginal space requirement factored in) to provide 1 ohm resistance. Thus, for 1 ohm resistance, the resistor 200 requires a minimum area of 625 $\mu m^2$ (5 $\mu m$ * 125 $\mu m$).

As the semiconductor processing technology advances, the electronic devices in an IC becomes increasingly small. Thus, the conventional resistors appear too large to be used in the ICs of new generation.

The present invention discloses a stack resistor structure constructed by a number of conductive plugs and contacts. The stack resistor structure may include several conductive layers and a semiconductor layer, which are separated by insulating material. The conductive plugs are formed between the conductive layers, while the contacts are formed between the bottom conductive layer and the semiconductor layer. Each column of the contact/plug and the conductive/semiconductor layer is defined as a resistor segment. As the semiconductor processing technology advances, the dimensions of the plugs and contacts become smaller, thereby causing their resistance to increase. For example, the contact or plug fabricated by the 0.13 $\mu m$ generation processing technology has resistance about 1 ohm, while that fabricated by the 90 nm technology has resistance about 16 ohms. As the technology advances into the 1 TMiM process, the resistance of the contact or plug becomes 36 ohms. As these plugs and contacts are small in size, they can be utilized as resistors for ICs made by, for example, the processing technology of 90 nm or more advanced generation.

Figure 3:
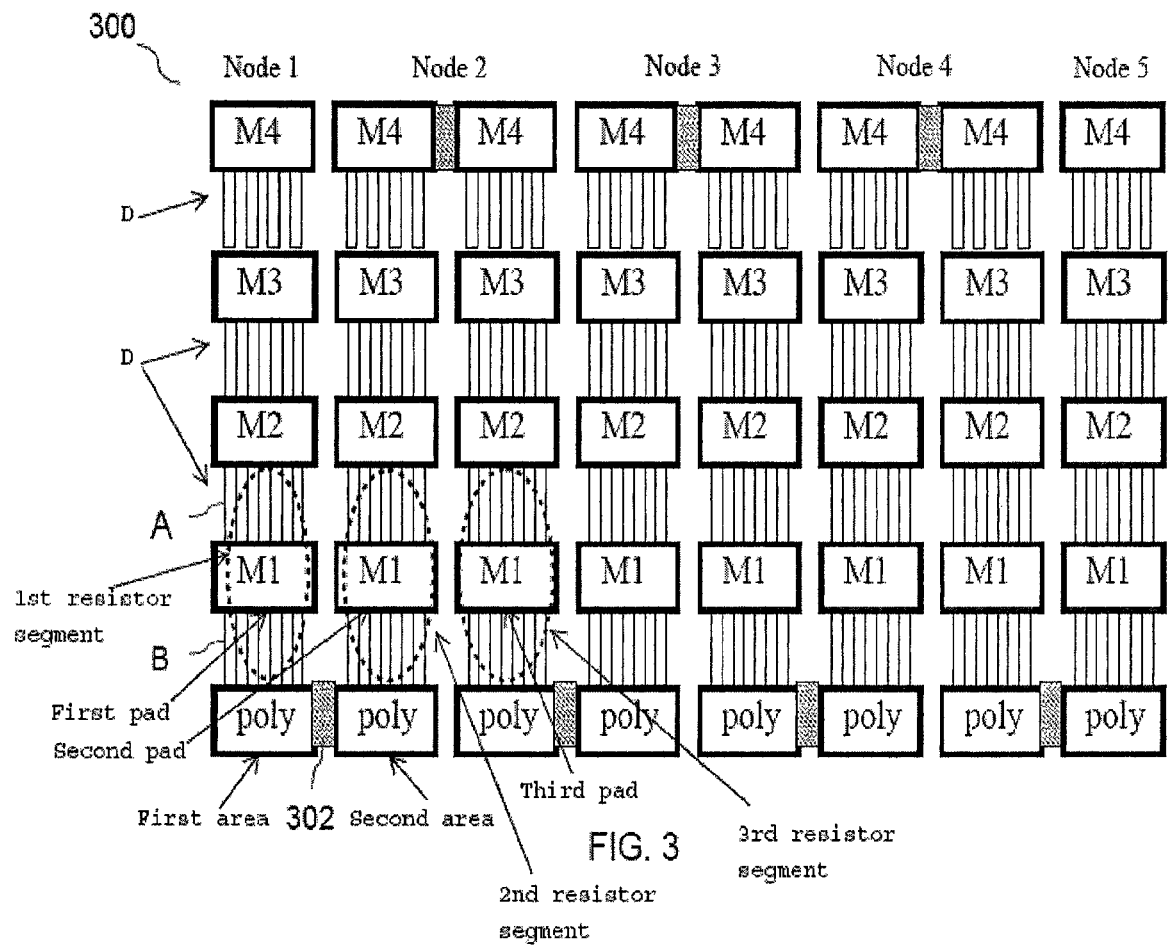
FIG. 3 illustrates a cross-section view of a resistor structure in accordance with one embodiment of the present invention.

FIG. 3 illustrates a cross-section view of a stack resistor structure 300 that includes multiple conductive plugs A and contacts B. Here, the conductive plugs refer to the conductive-material-filled vias disposed between any two vertically adjacent conductive layers, such as M1, M2, M3 and M4. Each conductive layer M1, M2, M3 and M4,includes a plurality of pads (M1, M2, M3, M4, first column [First pad], M1, M2, M3, M4, second column [Second pad], M1, M2, M3, M4, third column [Third pad]...M1, M2, M3, M4,nth column [nth pad]). The contact refers to the conductive-material-filled vias disposed between the underlying semiconductor layer which comprises a plurality of polysilicon areas/layers, ({POLY, first column} [First area], {POLY, second column} [Second area], {POLY, third column}[Third area] . . . {POLY, nth column}[nth area]) such as doped semiconductor regions or silicide layers, and a vertically adjacent conductive layer, such as M1. The conductive layers M1, M2, M3 and M4, are separated by insulating materials, D, that have a dielectric constant lower than about 3.0 for reducing the parasitic capacitance between conductive objects. A number of semiconductor layers doped with impurities and/or conductive silicide layers are formed underneath the bottom conductive layer M1. Each column of the contact/plug and the conductive/doped-semiconductor layer is defined as a resistor segment. For example, each column of the doped semiconductor layer, the contacts B, the conductive layers M1, M2, M3 and M4, and the plugs interposed there among is defined as a resistor segment. A number of conductive patterns 302 are disposed between two horizontally adjacent conductive layers for serially coupling the neighboring resistor segments. The nodes of the resistors are formed on the upper conductive layer, such as M4.

As discussed above, the plugs and contacts are particularly suitable for being used as resistors when they are made by the semiconductor processing technology of 90 nm generation or beyond. In this embodiment, the plug has a size ranging from 0.01 to 0.3 μm, and the contact has a size ranging from 0.01 to 0.3 μm. Both sizes are preferred to be between about 0.01 to about 0.1 μm in order to obtain better resistor performance. Two neighboring plugs are spaced by a distance ranging from about 0.015 to 2.0 μm. The length of contact and plug, which is determined by the thickness of the intermediate dielectric layer, ranges approximately from 0.1 to 2.0 um. Such small dimension allows the plugs and contacts to provide sufficient resistance, so that they can be used as resistors. The plugs and contacts for the resistor structure 300 can be made of any conductive material, such as W, Al, Cu, silicide or any metal alloy.

In FIG. 3, all of the resistor segments are serially coupled together as a resistor module. A number of such resistor segments can be coupled together in parallel to form a resistor array. In one embodiment, these parallel resistor segments can be used as voltage dividers in an analog-to-digital converter (ADC). One characteristic requirement for the resistor segments to function as the voltage dividers is that their resistances need to be uniform, such that the voltage can be divided equally. The improvement of uniformity is proportional to $(N \times M)^{1/2}$ where N is the number of the contacts or plugs in each conductive layer, and M is the number of stacked layers. In a real application, the number N×M can be designed to exceed 1000, such that the resistance uniformity can be improved significantly. Thus, the proposed resistor structure 300 is particularly suitable for being used as voltage dividers in the ADC.

Figure 4:
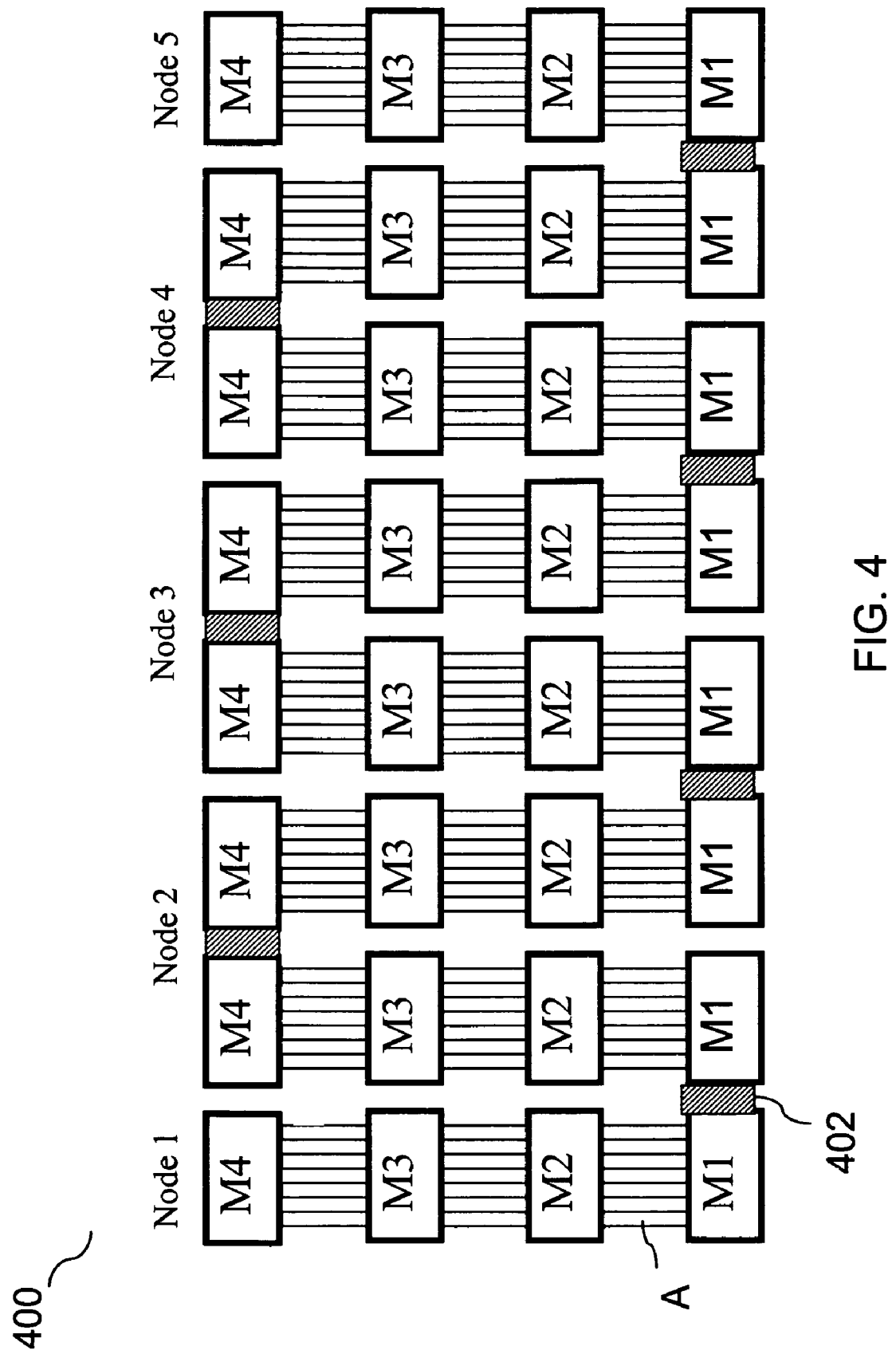
FIG. 4 illustrates a cross-section view of a resistor structure in accordance with another embodiment of the present invention.

FIG. 4 illustrates a cross-section view of a resistor structure 400 including a number of plugs in several conductive layers, which form a stack structure and are separated by insulating material with a dielectric constant lower than 3.0. The conductive layers include the layers M1, M2, M3 and M4. The metal plugs A are formed between the vertically adjacent conductive layers. Each column of the plugs and the conductive layers is defined as a resistor segment. For example, each column of the conductive layers M1, M2, M3 and M4, and the plugs interposed there among is defined as a resistor segment. A number of conductive patterns 402 are disposed between two horizontally adjacent conductive layers for serially coupling the neighboring resistor segments. The nodes of the resistors are formed on the upper conductive layer, such as M4.

Similar to the resistor structure 300 shown in FIG. 3, a number of such resistor segments in the resistor structure 400 can be coupled together in parallel to form a resistor array. These parallel resistor segments can be used as voltage dividers in an analog-to-digital converter (ADC). The plugs A also have dimensions and material similar as those of the plugs shown in FIG. 3.

The resistor structure 400 differs from the resistor structure 300 shown in FIG. 3 in that it does not include the contacts and doped semiconductor layers. Note that while four conductive layers are illustrated in this figure, the resistor structure 400 can have more or less than four conductive layers depending on various design requirements.

Figure 5:
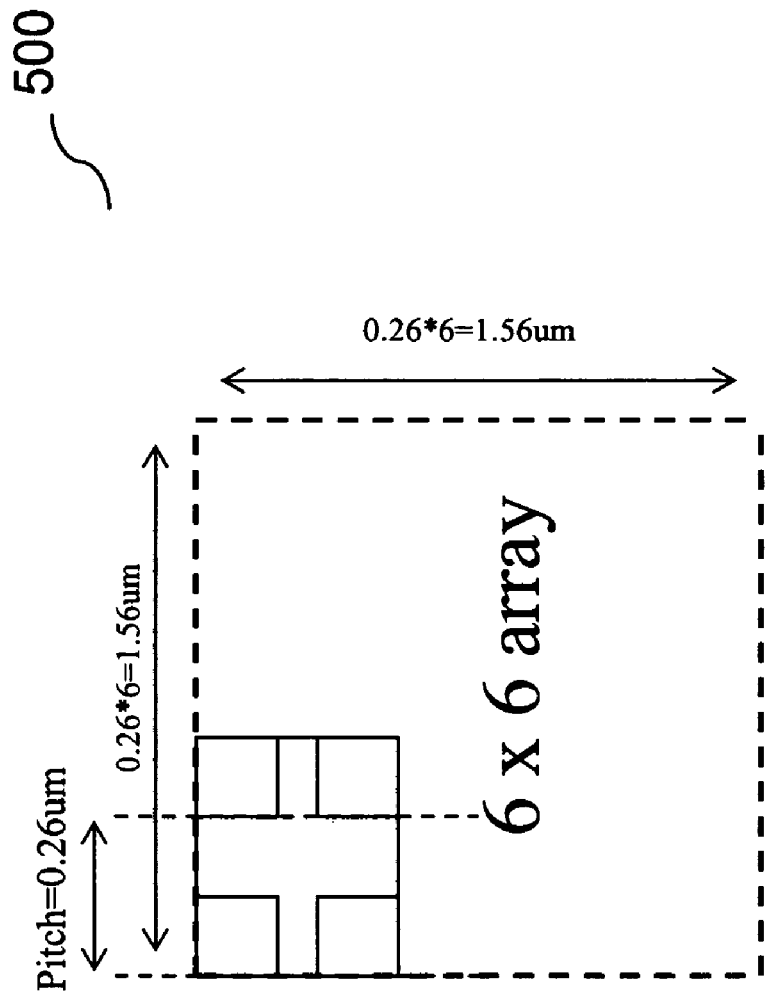
FIG. 5 shows the area efficiency of a 6×6 resistor array in accordance with one embodiment of the present invention.

FIG. 5 shows the area efficiency of a 6×6 resistor array layout in accordance with one embodiment of the present invention. The resistor array 500 contains 36 resistor segments arranged in parallel in an area of 2.44 μm² (1.56 μm×1.56 μm). If each of the resistor segments is formed by five conductive layers, a doped semiconductor layers, plugs and contacts, the segment can be designed to have a resistance of 20 ohms. A total resistance 1.1 ohm can be obtained by serially connecting two of such resistor arrays wherein the total resistance 1.1 ohm equals to 20×2/36. In this embodiment, 1.1 ohm resistance takes about 5.098 μm² (2.44×2+ 1.56×0.14), whereas in the prior art shown in FIG. 1, 1.0 ohm resistance takes about 30 μm², and in the prior art shown in FIG. 2, 1.0 ohm resistance takes about 625 μm². It is noted that the square-shaped via/contact shown in this figure is merely an example. Other shapes, such as round, irregularity, ellipse, etc, can also be used to design the via/contact.

Figure 6:
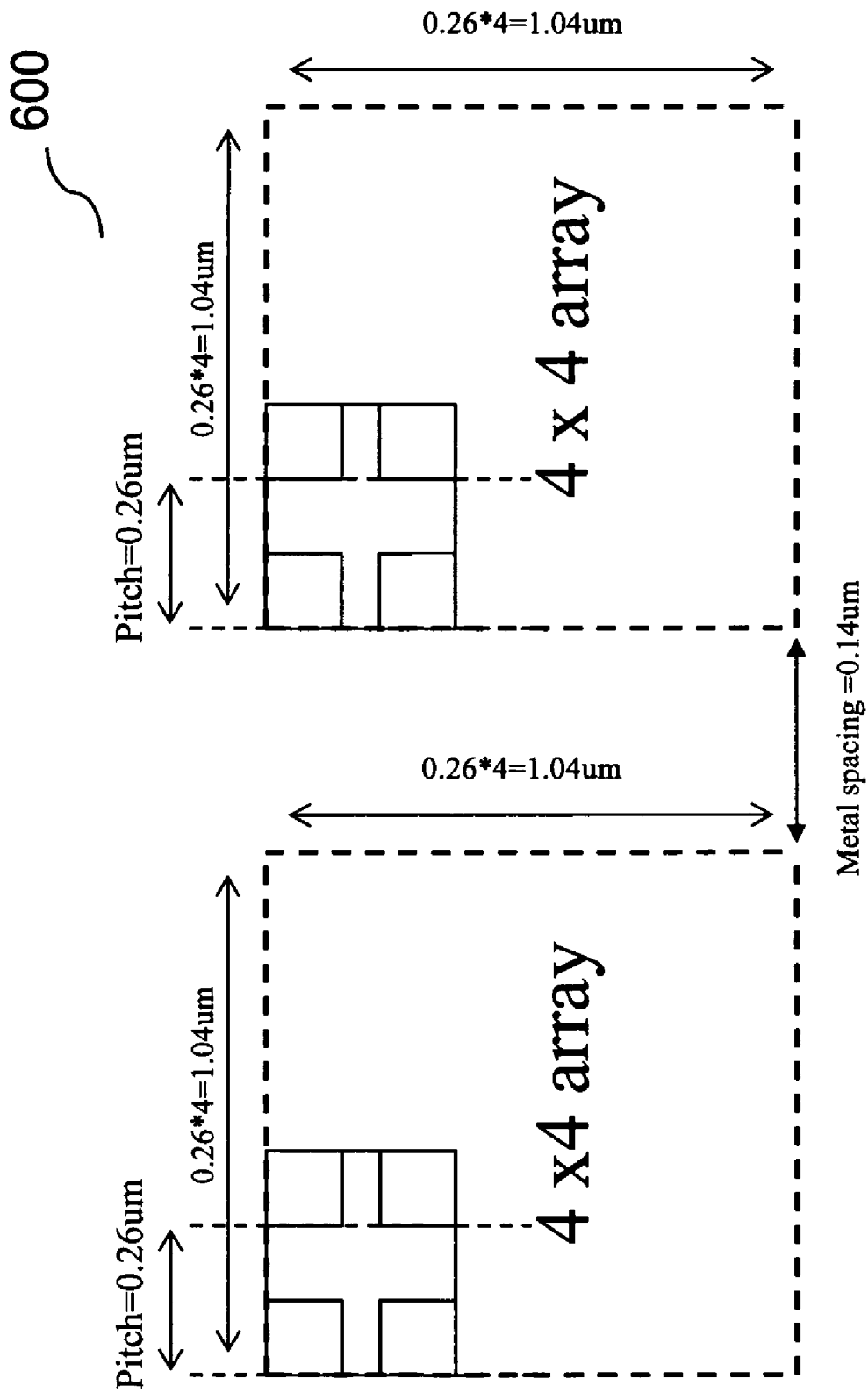
FIG. 6 shows the area efficiency of a 4×4 resistor array in accordance with one embodiment of the present invention.

FIG. 6 shows the area efficiency of the 4×4 resistor array in accordance with one embodiment of the present invention. Taking the marginal area into account, each resistor array 600 occupies an area of 1.39 μm² [(1.04+0.14)×(1.04+0.14)]. If each of the resistor segments is formed by five conductive layers and plugs, the segment can be designed to have a resistance of 4 ohms. A total resistance 1 ohm can be obtained by serially connecting four of such resistor arrays, each of which contains 16 resistor segments coupled in parallel. Mathematically, 1=4×4/16. Thus, in this embodiment, the area required for 1.0 ohm is 6.007 μm² (1.39×4+3×1.04× 0.14), whereas in the prior art shown in FIG. 1, 1.0 ohm resistance takes about 30 μm², and in the prior art shown in FIG. 2, 1.0 ohm resistance takes about 625 μm².

As discussed above, the proposed resistor structure can provide a desirable resistance in a much smaller area as opposed to the prior art. It also improves the resistance uniformity for a number of resistors. Thus, the proposed resistor structure would be ideally for using as voltage dividers in an ADC. Moreover, the process of forming the proposed resistor structure is compatible with the standard CMOS processing technology. Thus, it would not incur additional manufacturing costs.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A resistor structure for an integrated circuit, comprising:
a first set of contacts connected between a first area of a semiconductor layer and a first pad of a first conductive layer, wherein the contacts comprise conductive material-filled vias disposed on the first area of the semiconductor layer;
a second set of contacts disposed adjacent to the first set of contacts and connected between a second area of the semiconductor layer and a second pad of the first conductive layer, wherein the first pad is electrically isolated from the second pad and the first area is electrically isolated from the second area;

a first set of plugs connected between the first pad of the first conductive layer and a first pad of a second conductive layer, wherein the plugs comprise conductive material-filled vias disposed between any two vertically adjacent conductive layers; and a second set of plugs disposed adjacent to the first set of plugs and connected between the second pad of the first conductive layer and a second pad of the second conductive layer, wherein the first set of contacts and the first set of plugs are coupled together to form a first resistor segment, and the second set of contacts and the second set of plugs are coupled together to form a second resistor segment to provide a predetermined resistance for the integrated circuit.

2. The resistor structure of claim 1 further comprising:

a third set of contacts connected between a third area of the semiconductor layer and a third pad of the first conductive layer, the third set of contacts being disposed adjacent to the second set of contacts; and a third set of plugs connected between the third pad of the first conductive layer and a third pad of the second conductive layer, the third set of plugs being disposed adjacent to the second set of plugs, wherein the third set of contacts and the third set of plugs are coupled together as a third resistor segment disposed adjacent to the second resistor segment.

3. The resistor structure of claim 2 further comprising a conductive pattern serially connecting the first and second resistor segments together.

4. The resistor structure of claim 1 wherein the plug has a size ranging approximately from 0.01 to 0.1 μm.

5. The resistor structure of claim 1 wherein two neighboring plugs are spaced by a distance ranging approximately from 0.015 to 0.2 μm.

6. The resistor structure of claim 1 wherein the contact has a size ranging approximately from 0.01 to 0.3 μm.

7. The resistor structure of claim 1 further comprising insulating layers separating the semiconductor layer from the first conductive layer, and the first conductive layer from the second conductive layer.

8. The resistor structure of claim 7 wherein the insulating layers have a dielectric constant lower than 3.0 for reducing parasitic capacitance between the semiconductor substrate and the first conductive layer, and between the first conductive layer and the second conductive layer.

9. The resistor structure of claim 1 is implemented in an analog-to-digital converter as a voltage divider.

10. A stack resistor structure for an integrated circuit, comprising:

a first set of contacts connected between a first area of a semiconductor layer and a first pad of a first conductive layer, wherein the contacts comprise conductive material-filled vias disposed on the first area of the semiconductor layer;

a second set of contacts disposed adjacent to the first set of contacts and connected between a second area of the semiconductor layer and a second pad of the first conductive layer, wherein the first pad is electrically isolated from the second pad and the first area is electrically isolated from the second area;

a first set of plugs connected between the first pad of the first conductive layer and a first pad of a second conductive layer, wherein the plugs comprise conductive material-filled vias disposed between any two vertically adjacent conductive layers and the first set of contacts and the first set of plugs are coupled together to form a first resistor segment;

a second set of plugs connected between the second pad of the first conductive layer and a second pad of the second conductive layer, wherein the second set of contacts and the second set of plugs are coupled together to form a second resistor segment;

a third set of contacts disposed adjacent to the second set of contacts and connected between a third area of the semiconductor layer and a third pad of the first conductive layer;

a third set of plugs disposed adjacent to the second set of plugs and connected between the third pad of the first conductive layer and a third pad of the second conductive layer, wherein the third set of contacts and the third set of plugs are coupled together to form a third resistor segment adjacent to the second resistor segment; and a conductive pattern serially connecting the first and second resistor segments together to provide a predetermined resistance for the integrated circuit.

11. The resistor structure of claim 10 wherein the plug has a size ranging approximately from 0.01 to 0.1 μm.

12. The resistor structure of claim 10 wherein two neighboring plugs are spaced by a distance ranging approximately from 0.015 to 0.2 μm.

13. The resistor structure of claim 10 wherein the contact has a size ranging approximately from 0.01 to 0.3 μm.

14. The resistor structure of claim 10 is implemented in an analog-to-digital converter as a voltage divider.

\* \* \* \* \*